(12) United States Patent
Minixhofer

(10) Patent No.: US 9,837,573 B2
(45) Date of Patent: Dec. 5, 2017

(54) METHOD OF PRODUCING A RADIATION SENSOR SEMICONDUCTOR DEVICE COMPRISING A MULTIPLE COLOR FILTER

(71) Applicant: ams AG, Unterpremstaetten (AT)

(72) Inventor: Rainer Minixhofer, Unterpremstaetten (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/769,090

(22) PCT Filed: Feb. 4, 2014

(86) PCT No.: PCT/EP2014/052128
§ 371 (c)(1),
(2) Date: Aug. 19, 2015

(87) PCT Pub. No.: WO2014/127988
PCT Pub. Date: Aug. 28, 2014

(65) Prior Publication Data
US 2016/0013355 A1    Jan. 14, 2016

(30) Foreign Application Priority Data
Feb. 19, 2013  (EP) ................... 13155765

(51) Int. Cl.
*H01L 31/18* (2006.01)
*H01L 27/146* (2006.01)
*H01L 27/144* (2006.01)
*H01L 31/0216* (2014.01)
*G02B 5/20* (2006.01)

(52) U.S. Cl.
CPC .......... *H01L 31/18* (2013.01); *H01L 27/1446* (2013.01); *H01L 27/14621* (2013.01); *H01L 27/14685* (2013.01); *H01L 31/02162* (2013.01); *G02B 5/201* (2013.01)

(58) Field of Classification Search
CPC ............... G02B 5/201; G02B 5/223; H01L 2224/13099; H01L 2224/13144; H01L 2224/13655; H01L 2224/45144; H01L 2924/00; H01L 2924/0001; H01L 2924/00014; H01L 2924/01027; H01L 2924/15787; H01L 51/0005
USPC ............ 347/106, 12, 13, 44; 252/586; 257/E21.508, E21.511, E23.021
See application file for complete search history.

(56) References Cited

U.S. PATENT DOCUMENTS

| | | | |
|---|---|---|---|
| 2002/0008464 A1* | 1/2002 | Christensen ........ | H01L 27/308 313/498 |
| 2002/0105688 A1* | 8/2002 | Katagami ........... | B41J 2/155 358/505 |
| 2003/0030715 A1* | 2/2003 | Cheng ................ | B41J 3/407 347/106 |

(Continued)

*Primary Examiner* — William F Kraig
*Assistant Examiner* — Edward Chin
(74) *Attorney, Agent, or Firm* — McDermott Will & Emery LLP

(57) ABSTRACT

The method comprises the steps of providing a semiconductor device comprising a semiconductor layer (1) with at least one radiation sensor (6) and a dielectric layer (2), arranging a web (3) comprising a plurality of recesses (4) on the dielectric layer, and introducing ink of different colors (A, B, C) in the recesses by inkjets (I).

9 Claims, 2 Drawing Sheets

(56) References Cited

U.S. PATENT DOCUMENTS

| | | | |
|---|---|---|---|
| 2003/0115749 A1* | 6/2003 | Chen | H01L 24/11 |
| | | | 29/848 |
| 2004/0229139 A1* | 11/2004 | Tanaka | G02B 5/201 |
| | | | 430/7 |
| 2005/0024403 A1* | 2/2005 | Shigemura | B41J 2/1652 |
| | | | 347/12 |
| 2005/0212841 A1* | 9/2005 | Okano | B41J 2/01 |
| | | | 347/13 |
| 2006/0115749 A1 | 6/2006 | Toyoda | |
| 2007/0196568 A1* | 8/2007 | Kim | G02F 1/133512 |
| | | | 427/162 |
| 2008/0230753 A1* | 9/2008 | Takiguchi | G02B 5/201 |
| | | | 252/586 |
| 2009/0004442 A1* | 1/2009 | Danner | G02F 1/167 |
| | | | 428/195.1 |
| 2009/0231521 A1* | 9/2009 | Kashiwagi | G02B 5/201 |
| | | | 349/106 |
| 2010/0117991 A1 | 5/2010 | Koyama et al. | |
| 2011/0187267 A1* | 8/2011 | Yamamoto | G02B 5/201 |
| | | | 313/504 |
| 2012/0242940 A1* | 9/2012 | Nagata | G03F 7/105 |
| | | | 349/106 |

* cited by examiner

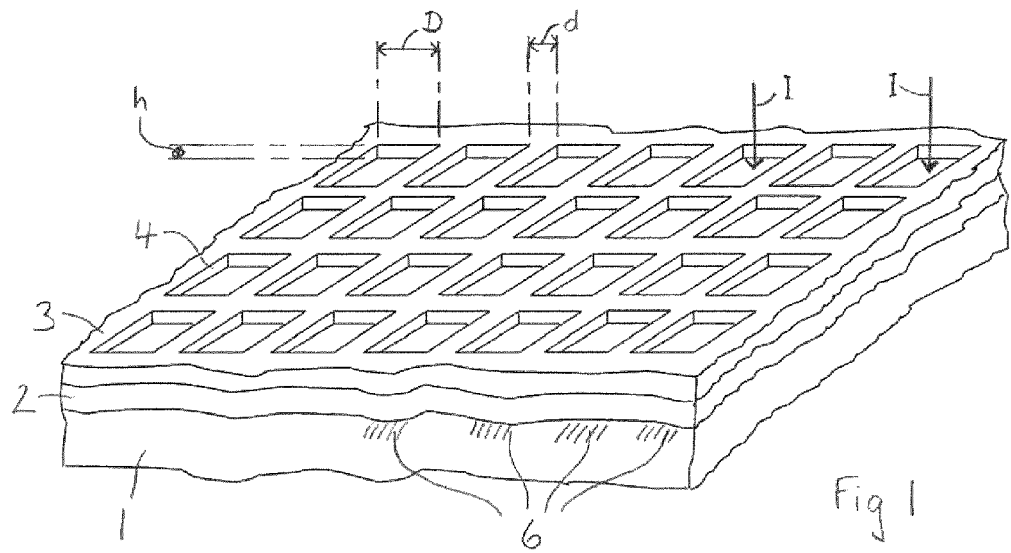
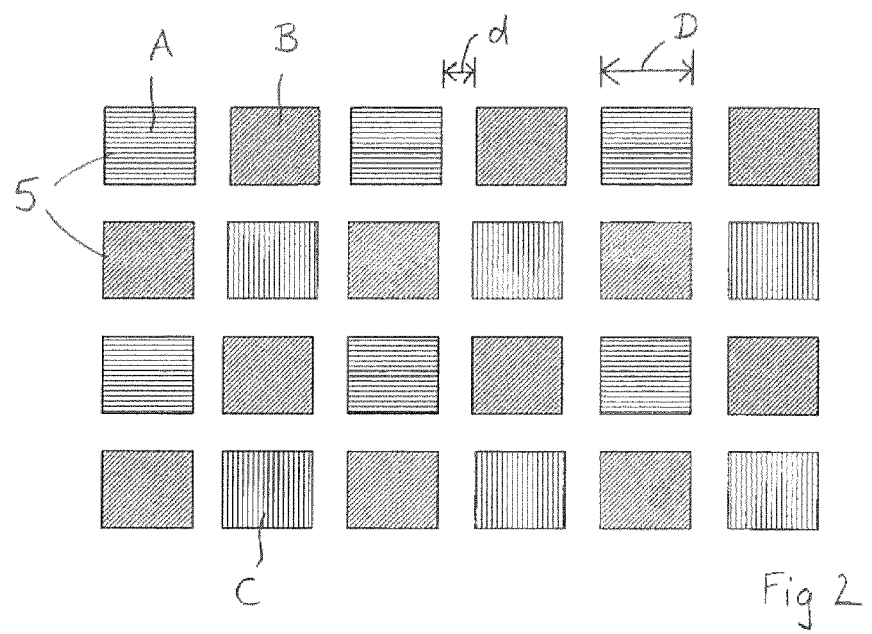

METHOD OF PRODUCING A RADIATION SENSOR SEMICONDUCTOR DEVICE COMPRISING A MULTIPLE COLOR FILTER

BACKGROUND OF THE INVENTION

Radiation sensor semiconductor devices, especially for detecting ambient light, comprise RGB polymer filters as color filters, which use metallic components in the polymer to establish the desired absorption characteristics.

US 2008/0230753 A1 discloses the production of a multiple color filter on an optically transparent substrate by application of an inkjet method.

SUMMARY OF THE INVENTION

The method of producing a radiation sensor semiconductor device with a multiple color filter comprises the steps of providing a semiconductor device comprising a semiconductor layer with at least one radiation sensor and a dielectric layer, arranging a web comprising a plurality of recesses on the dielectric layer, and introducing ink of different colors in the recesses by inkjets.

In variants of the method the web is formed from a semiconductor material like silicon, for example.

In further variants of the method, the web is formed with a height in the range between 0.5 μm and 100 μm, in particular in the range between 10 μm and 20 μm.

In further variants of the method, the recesses are arranged according to an array of color pixels, in particular at a distance of less than 10 μm from one another. The recesses may have a lateral dimension of more than 50 μm or even more than 100 μm, for example.

The following is a detailed description of examples of the method of production.

BRIEF DESCRIPTION OF THE DRAWINGS

FIG. 1 is a perspective view of a sensor device.
FIG. 2 shows a pixel pattern comprising squares.

DETAILED DESCRIPTION

Figure 3:
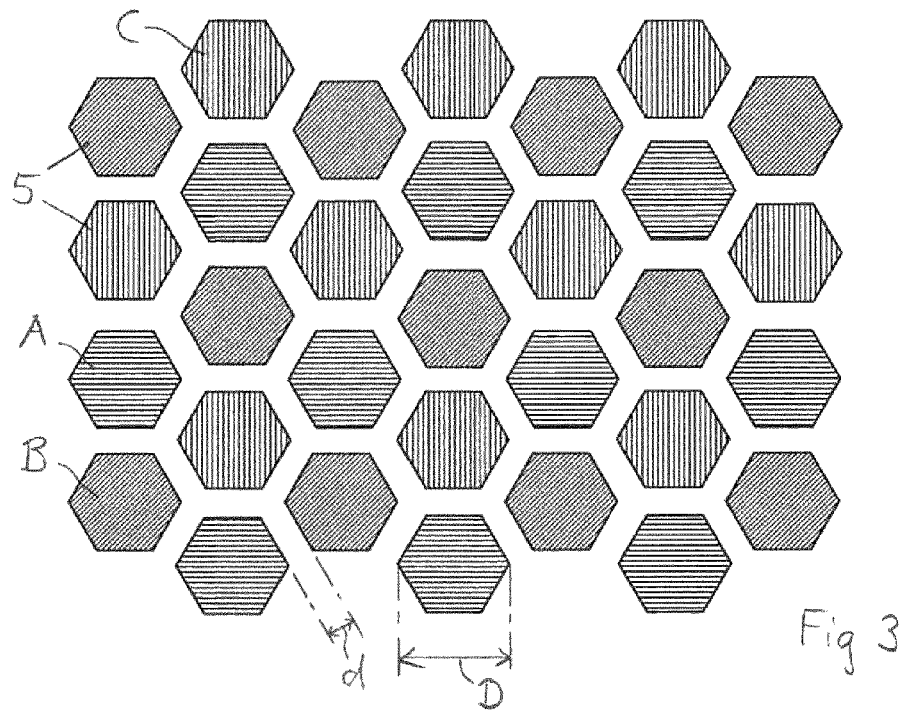
FIG. 3 shows a further pixel pattern comprising hexagons.

FIG. 1 is a perspective view of a sensor device comprising a semiconductor layer 1, a dielectric layer 2 above the semiconductor layer 1, and a web 3 forming a plurality of recesses 4. The semiconductor layer 1 may comprise any semiconductor body like a silicon substrate, for example, which is provided with at least one integrated radiation sensor 6 like a photodiode, for example, which is schematically indicated in FIG. 1 by hatched regions in the semiconductor layer 1. A plurality of radiation sensors 6 may be provided to form an array of pixels. Structured metal layers of a wiring may be embedded in the dielectric layer 2. The wiring may provide electric connections for the integrated radiation sensor or array of radiation sensors and/or for further integrated components forming an integrated circuit, for example. The dielectric layer 2 may also be provided as a covering or passivating layer above the integrated radiation sensor or array of radiation sensors. The web 3 may be a semiconductor material like silicon, for instance. The web 3 can be formed by applying its material on the entire surface of the dielectric layer 2 and subsequently producing the recesses 4, which may be etched through openings of a suitable mask.

The recesses 4 may be formed to penetrate the layer forming the web 3, so that the dielectric layer 2 is exposed in the recesses 4. The depth of the recesses 4 may optionally be less than the height h of the web 3. The depth of the recesses 4 is adapted to the filter to be produced, so that the recesses 4 allow the accommodation of a sufficient amount of ink. The height h of the web 3 may typically be in the range between 0.5 μm and 100 μm and may especially be restricted to the range between 10 μm and 20 μm.

The recesses 4 are at least partially filled with ink of different colors to form the filter. The ink is applied by inkjets I, which may especially be generated by an inkjet printing device. Any generally known inkjet printing device may be suitable for this purpose. The inkjet printing device may be used to disperse multiple types of ink into the recesses 4. Inkjets I are indicated in FIG. 1 by arrows pointing to the recesses 4. As the inkjets I can individually be directed to the recesses 4, no masks are necessary in this step. The use of a mask can thus be limited to the step of etching the recesses 4. The described method facilitates the production of a large number of color filters.

An inkjet generated by an inkjet printing device is accurate to within about 5 μm, and lateral deviations from the target area may in particular be limited to an average distance of typically about 1 μm. This accuracy is more than sufficient for typical sizes of the individual filter areas, because the recesses 4 are typically formed to have a lateral dimension D of more than 50 μm, especially of more than 100 μm. The lateral dimension D can be a diameter or a side of a polygon like a square, hexagon or octagon, for example.

The width of the web 3, defining the distance d between neighbouring recesses 4, can be limited to a few microns, typically about 5 μm, for example. The recesses 4 may therefore be arranged at a distance d of less than 10 μm from one another. The pitch of a pixel array formed by the integrated radiation sensors can thus be kept sufficiently small, according to the requirements of the individual application.

FIG. 2 shows a pattern of pixels 5 of different colors, which can be formed by the method described. The different colors are indicated in FIG. 2 by different hatchings. The first color pixels A may be red, the second color pixels B may be green, and the third color pixels C may be blue, for example, to form an RGB filter. The method is not only suitable for the example shown in FIG. 2 but for a large variety of arrangements of the color pixels A, B, C. The colors may be distributed in many different patterns, according to the individual requirements. In the example shown in FIG. 2, the individual filter areas forming the pixels 5 are squares of equal lateral dimension D, but they can instead have other shapes. The shapes and sizes of the individual filter areas may vary between the color pixels 5 of different arrays, and they may also vary among the color pixels 5 of the same array.

The shapes of the filter areas of different colors forming the color pixels 5 are defined by the shapes of the recesses 4 in the web 3 and are easily reproduced by the application of inkjets. The distance d between the pixels 5 may be constant, as shown in the example of FIG. 2, or may vary. The pixels 5 may be arranged in a symmetrical pattern or on a regular lattice, as shown in the example of FIG. 2, or the pixels 5 may instead be irregularly arranged or statistically distributed. The method is applicable to form multiple color filters of a large variety of patterns.

FIG. 3 shows a further pattern of pixels 5 of different colors, indicated by different hatchings as in FIG. 2. The pattern of FIG. 3 comprises pixels 5 in the shape of hexagons. The arrangement of the hexagons within the array and the distribution of the first color pixels A, the second color pixels B, and the third color pixels C may be varied. The distance d between the pixels 5 and a maximal lateral dimension D are indicated in FIG. 3.

Figure 4:
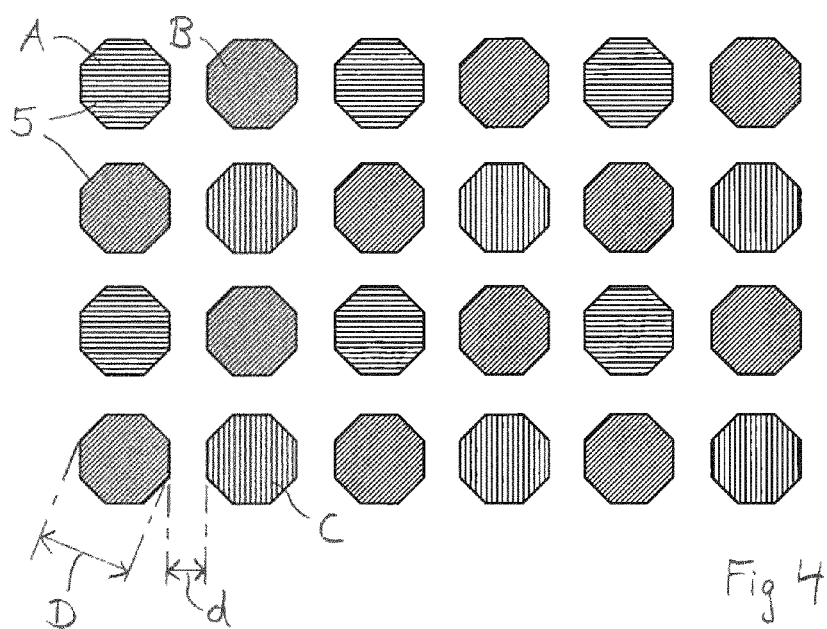
FIG. 4 shows a further pixel pattern comprising octagons.

FIG. 4 shows a further pattern of pixels 5 of different colors, indicated by different hatchings as in FIGS. 2 and 3. The pattern of FIG. 4 comprises pixels 5 in the shape of octagons. The arrangement of the octagons within the array and the distribution of the first color pixels A, the second color pixels B, and the third color pixels C may be varied. The distance d between the pixels 5 and a maximal lateral dimension D are indicated in FIG. 4.

The method also facilitates the production of multiple types of multiple color filters during the same manufacturing process. As the filter areas of different colors are defined by the web 3 and no further mask is used, the alignment of the filter areas can easily be optimized within the accuracy of the inkjet printing device. The method has the further advantage that it allows the formation of a multiple color filter directly on the semiconductor device comprising the radiation sensor, so that no separate filter layer has to be mounted to the semiconductor device.

The invention claimed is:

1. A method of producing a radiation sensor semiconductor device with a multiple color filter, comprising:
   providing a semiconductor device comprising a semiconductor layer with at least one radiation sensor formed within the semiconductor layer, and a dielectric layer;
   arranging a web comprising a plurality of recesses on the dielectric layer; and
   introducing ink of different colors in the recesses by inkjets,
   wherein the web is semiconductor material,
   wherein the dielectric layer is arranged between the semiconductor layer and the semiconductor material of the web,
   wherein the recesses are formed in the semiconductor material of the web, and
   wherein the dielectric layer is arranged above the at least one radiation sensor.

2. The method of claim 1, wherein the web is formed from silicon.

3. The method of claim 1, wherein the web is formed with a height in the range between 0.5 µm and 100 µm.

4. The method of claim 1, wherein the web is formed with a height in the range between 10 µm and 20 µm.

5. The method of claim 1, wherein the recesses are arranged according to an array of color pixels.

6. The method of claim 1, wherein the recesses are arranged at a distance of less than 10 µm from one another.

7. The method of claim 1, wherein the recesses have a lateral dimension of more than 50 µm.

8. The method of claim 1, wherein the recesses have a lateral dimension of more than 100 µm.

9. A method of producing a radiation sensor semiconductor device with a multiple color filter, comprising:
   providing a semiconductor device comprising a semiconductor layer with at least one radiation sensor formed within the semiconductor layer, and a dielectric layer;
   forming a web comprising a plurality of recesses on the dielectric layer, wherein the web is semiconductor material; and
   introducing ink of different colors in the recesses by inkjets,
   wherein the dielectric layer is arranged between the semiconductor layer and the semiconductor material of the web,
   wherein the recesses are formed in the semiconductor material of the web, and
   wherein the dielectric layer is arranged above the at least one radiation sensor.

\* \* \* \* \*